United States Patent

Pate

[11] Patent Number: 5,984,128
[45] Date of Patent: Nov. 16, 1999

[54] TAMPER RESISTANT BOX

[76] Inventor: Britt Pate, 525 Circle Lake Rd., Wichita, Kans. 67209

[21] Appl. No.: 09/083,528

[22] Filed: May 22, 1998

[51] Int. Cl.$^6$ .................................................. B65D 25/24
[52] U.S. Cl. ............................................................. 220/480
[58] Field of Search .................................. 220/4.33, 476, 220/480

[56] References Cited

U.S. PATENT DOCUMENTS

| | | | |
|---|---|---|---|
| 1,932,773 | 10/1933 | Eschenbach | 220/4.33 |
| 2,878,955 | 3/1959 | Hagan | 220/476 |
| 3,729,113 | 4/1973 | Lopatka | 220/480 |
| 3,966,285 | 6/1976 | Porch et al. | 220/4.33 |

FOREIGN PATENT DOCUMENTS 115138  5/1942  Australia ............................... 220/4.33

Primary Examiner—Stephen Castellano
Attorney, Agent, or Firm—Kenneth Jack

[57] ABSTRACT

A tamper resistant box for shielding from tampering a telephone system junction box installed upon a wall of a building, consisting of a pair of side walls; an upper or lower wall fixedly attached to or homogeneously fused with the upper or lower ends of the side walls, the upper or lower wall spanning between the side walls; wall attaching means fixedly attached to or homogeneously fused with the inward ends of the side walls; an access panel fitted so that it may span between the lower or upper ends of the side walls; access panel attaching means capable of removably attaching the access panel to the lower or upper ends of the side walls; a false access panel fitted so that it may span between the outer ends of the side walls and so that it may span between the outer ends of the upper or lower wall and the access panel; and false access panel attaching means capable of permanently attaching the false access panel to the outer ends of the side walls.

14 Claims, 4 Drawing Sheets

TAMPER RESISTANT BOX

RELATED PATENT APPLICATION

This patent application is related to U.S. patent application Ser. No. 08/832,366; entitled: Wire Protecting Shield; Filed: Apr. 2, 1997; Inventor: Britt Pate; such application being assigned to Group Art No. 2109; Examiner: Dhiru Patel.

FIELD OF THE INVENTION

This invention relates to metal boxes attachable to walls of buildings, such boxes functioning to protect telephone wire junction boxes from tampering by burglars or intruders.

BACKGROUND OF THE INVENTION

Telephone wire junction boxes which are installed upon exterior walls of residences or commercial buildings, and are uncovered, are easily tampered with by burglars or intruders. A burglar who gains access to a telephone wire junction box may easily disable the telephone system of the building, preventing "911" or emergency telephone calls from being made in response to an intrusion. Thus, it is desireable to shield such telephone wire junction boxes from such tampering by installing thereover of a protective tamper resistant metal box.

The interior of such protective metal boxes ordinarily must be freely accessible for purposes of telephone system repair, and be inaccessible to burglars or intruders. A known method of facilitating accessibility for purposes of repair and inaccessibility to burglars is to provide a box having a hinged panel locked by a hasp or bolt controlled by a key. Where such an access panel is openable and closeable by means of a key lock, access to the telephone wire junction box may be restricted to authorized persons. However, it is uneconomical to construct a telephone wire junction protecting box having access panel having a key lock.

Another known method of restricting unauthorized access to the interior of such tamper resistant boxes is to provide a hinged or removable panel which is locked in place by a common padlock. However, common padlocks may be easily cut by a bolt cutter which is a common burglary tool. The instant invention solves such problems by providing a tamper resistant telephone wire junction protecting box which restricts access by burglars or intruders, which allows free access for purposes of telephone system repair, and which does not require utilization of key locks or padlocks. Such objectives are accomplished through the utilization of an access panel and a false access panel attached by screws and adhesives adapted and positioned to cause a burglar or intruder to erroneously conclude that easy access into the box is not possible.

PRIOR ART PATENTS

U.S. Pat. No. 5,369,548 issued Nov. 29, 1994, to Combs discloses a tamper protection enclosure for a distribution box.

U.S. Pat. No. 5,315,654 issued May 24, 1994, to Kraft discloses an armored telephone line protective system.

None of the above disclosed patents teach, disclose or describe the novel, inventive, useful and unique aspects, elements and features of the present inventive tamper resistant box.

BRIEF SUMMARY OF THE INVENTION

The present inventive tamper resistant box comprises a sheet metal upper wall or lower wall and a pair of side walls which are continuous with the upper or lower wall; the side walls extending perpendicularly downward or upward from the upper or lower wall. The rearward edges of the upper or lower wall and side walls have inwardly extending flanges, such flanges having screw receiving apertures extending therethrough. The lower or upper ends of the side walls also have inwardly extending apertured flanges, such flanges facilitating attachment of a lower or upper access panel. The forward ends of the upper or lower wall and the side walls similarly have inwardly extending apertured flanges, such flanges facilitating attachment of a false access panel. The false access panel preferably is sheet metal and is fitted to completely close the forward end of the box; the false access panel having screw receiving apertures therethrough, such apertures being positioned to align with the apertures of the flanges extending from the forward ends of the upper or lower wall and the side walls. The ends of the upper or lower access panel also are preferably apertured for receipt of screws for attachment to the flanges extending inwardly from the upper or lower ends of the side walls. The rearward edge of the access panel may, where necessary, be notched, such notch being fitted to closely overlie a shielded telephone wire which typically extends into the interior of the box.

The assembly of the inventive tamper resistant box preferably includes common removable slot headed sheet metal screws attaching the access panel to the lower or upper ends of the side walls. After installation of the access panel, the square or rectangular box frame is preferably placed against the wall of a building or residence in a position wherein its upper or lower wall, side walls, and access panel surround a telephone wire junction box in need of protection. With the box frame so positioned, common slot headed screws are utilized to attach the box to the wall, the screws extending through the apertures of the flanges extending inwardly from the rearward ends of the side walls and the upper or lower wall. After such attachment of the upper or lower wall, and side walls to the wall, a false access panel is fixedly attached to the frame so that it covers the forward opening of the box. Preferably, one way slot headed screws are utilized for such attachment, the screws preferably being fixed in placed by a permanent adhesive such as "lock tight." Alternately, one way slot headed screws may be utilized without the adhesive, or common slotted screws may be used with the adhesive.

In operation of the inventive tamper resistant box, a burglar seeking access to the interior of the box will be unable to remove the false access panel through the operation of the adhesive or the one way slot headed screws. At night, in the dark, a burglar will assume that all panels of the box are similarly affixed and the burglar will not detect that the lower or upper access panel is easily removed. During daylight, when telephone system repairs are commonly performed, a telephone repair person may easily discover the upper or lower access panel. Alternately, a building occupant who is knowledgeable of the features of the box, may inform the repair person of the access panel.

Where the tamper resistant box is utilized to protect a telephone wire junction box installed at a low elevation, the box's access panel is installed at the lower end of the box. Where the junction box is installed high upon the wall, it is preferable that the access panel be installed at the upper end of the box. Through selective installation of the access panel at the upper or lower end of the tamper resistant box, depending on the elevation of the junction box, burglars or intruders may be prevented from having a convenient view of the removable screws of the access panel.

Accordingly, it is an object of the present invention to provide a tamper resistant box for shielding a telephone wire junction box from tampering by burglars or intruders, such tamper resistant box utilizing an access panel and a false access panel, such panels being positioned and affixed so that they allow easy access for purposes of telephone system repair, and so that they cause burglars or intruders to conclude that easy access into the box is not possible.

It is a further object of the present invention to provide such a tamper resistant box which is economically constructed.

It is a further object of the present invention to provide such a tamper resistant box which is simply and efficiently constructed and is easily installed upon a building.

Other and further objects, benefits and advantages of the present inventive tamper resistant box will become known to those skilled in the art upon review of the Detailed Description which follows and upon review of the appended drawings.

DETAILED DESCRIPTION OF THE PREFERRED EMBODIMENT

Figure 1:
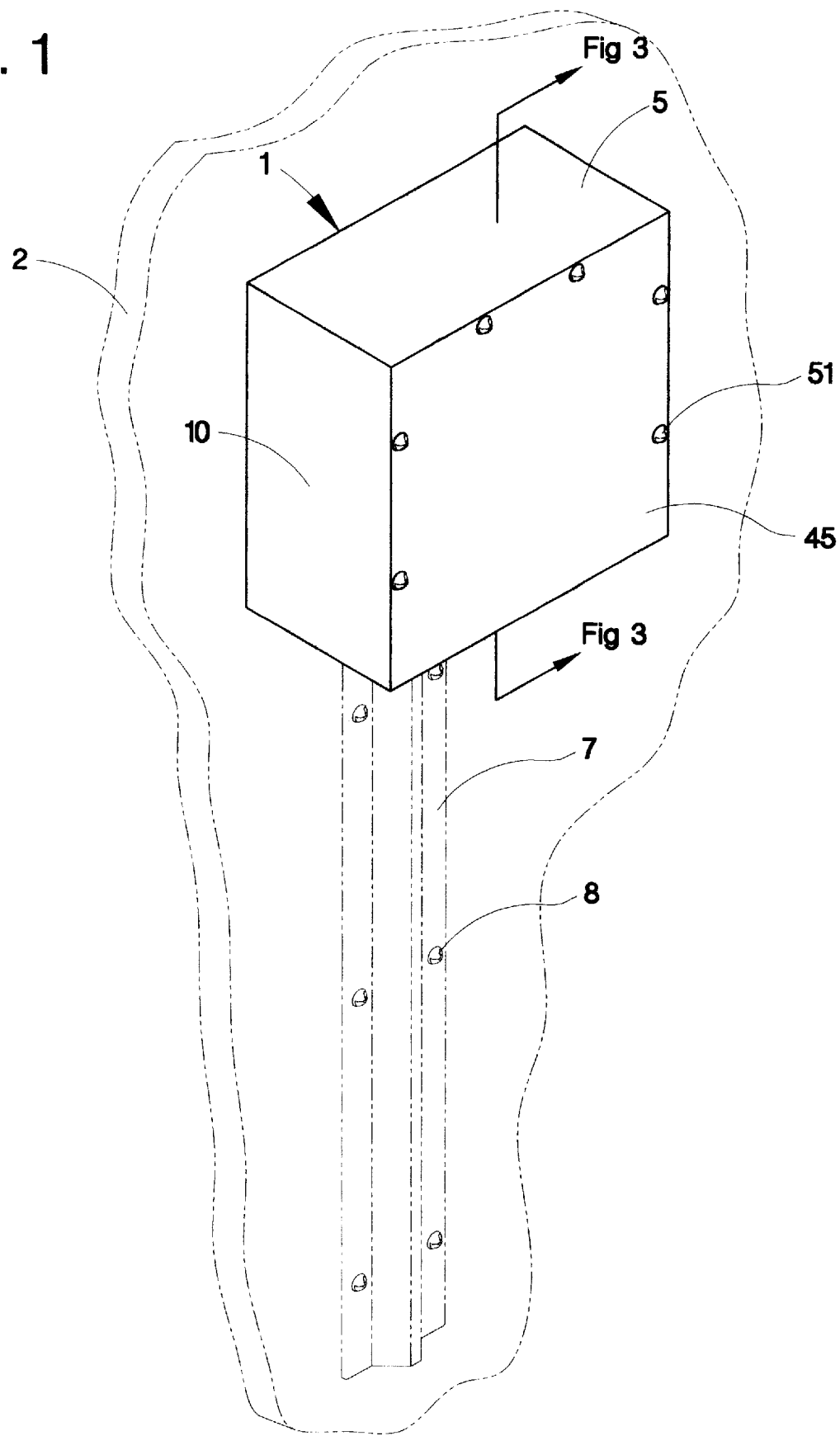
FIG. 1 is an isometric view of the present inventive tamper resistant box installed upon a wall of a building or residence.

Referring now to the drawings, and in particular to FIG. 1, the present inventive tamper resistant box is referred to generally by Drawing Element No. 1. The tamper resistant box 1 has an upper wall 5 and, referring to FIG. 2, a pair of side walls 10 extending downward from the upper wall 5. The forward ends of the upper wall 5 and of the side walls 10 have inwardly extending flanges 15, each such flange 15 preferably having a pair of screw receiving apertures 20 therethrough. The rearward ends of the upper wall 5 and the side walls 10 similarly have inwardly extending flanges 25, each such flange 25 preferably having a pair of screw receiving apertures 30 therethrough. The lower ends of the side walls 10 also preferably have inwardly extending flanges 35, each such flange 35 preferably having three screw receiving apertures 40 therethrough. The open forward end of the box 1 preferably is closed by a false access panel 45. The false access panel 45 preferably has six screw receiving apertures 50 therethrough, the screw receiving apertures 50 being positioned to allow alignment with the screw receiving apertures 20 of the flanges 15. An access panel 55 closes the lower end of the box 1, each end of the lower access panel 55 having three screw receiving apertures 60 therethrough, the screw receiving apertures 60 being positioned to allow alignment with the screw receiving apertures 40 of flanges 35.

Figure 2:
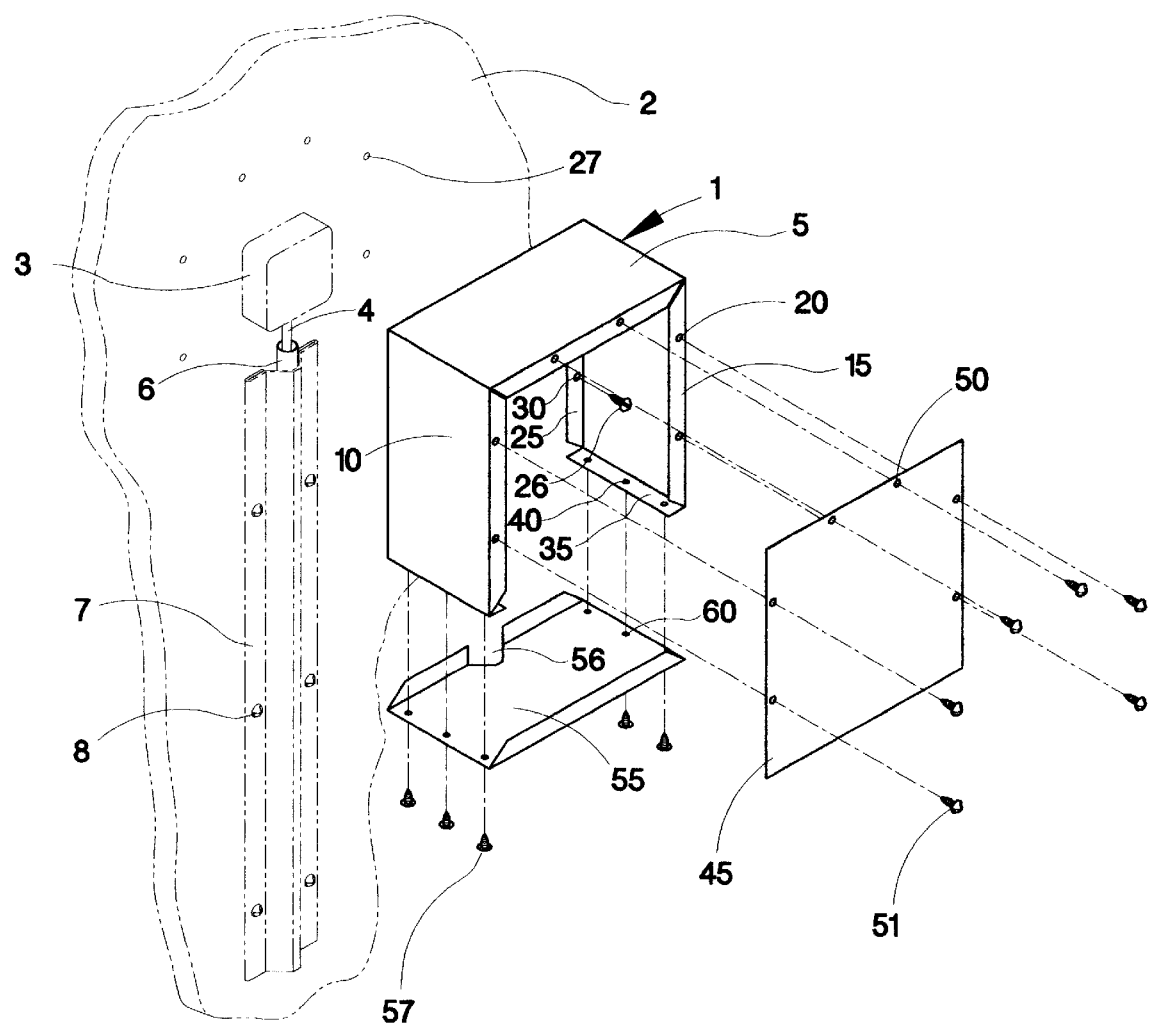
FIG. 2 is an exploded isometric view of the tamper resistant box showing an underlying telephone wire junction box, and shielded cable and conduit.

Referring to FIG. 1, the tamper resistant box 1 preferably is assembled in place upon the wall 2 of a building or residence. As can be seen in FIG. 2, the upper wall 5, the side walls 10, and the access panel 55 of the tamper resistant box 1 surround a telephone wire junction box 3 which is installed upon the wall 2. Such telephone wire junction boxes 3 typically have a bundle of telephone wires 4 extending downwardly to the ground. Such wires may be shielded by an electrical conduit 6, and by a wire shield 7, such as is disclosed in U.S. Pat. No. 5,796,034 Aug. 18, 1998, to Pate; the wire protecting shield 7 preferably being affixed to the wall 2 by means of one way slot headed screws 8.

Figure 3:
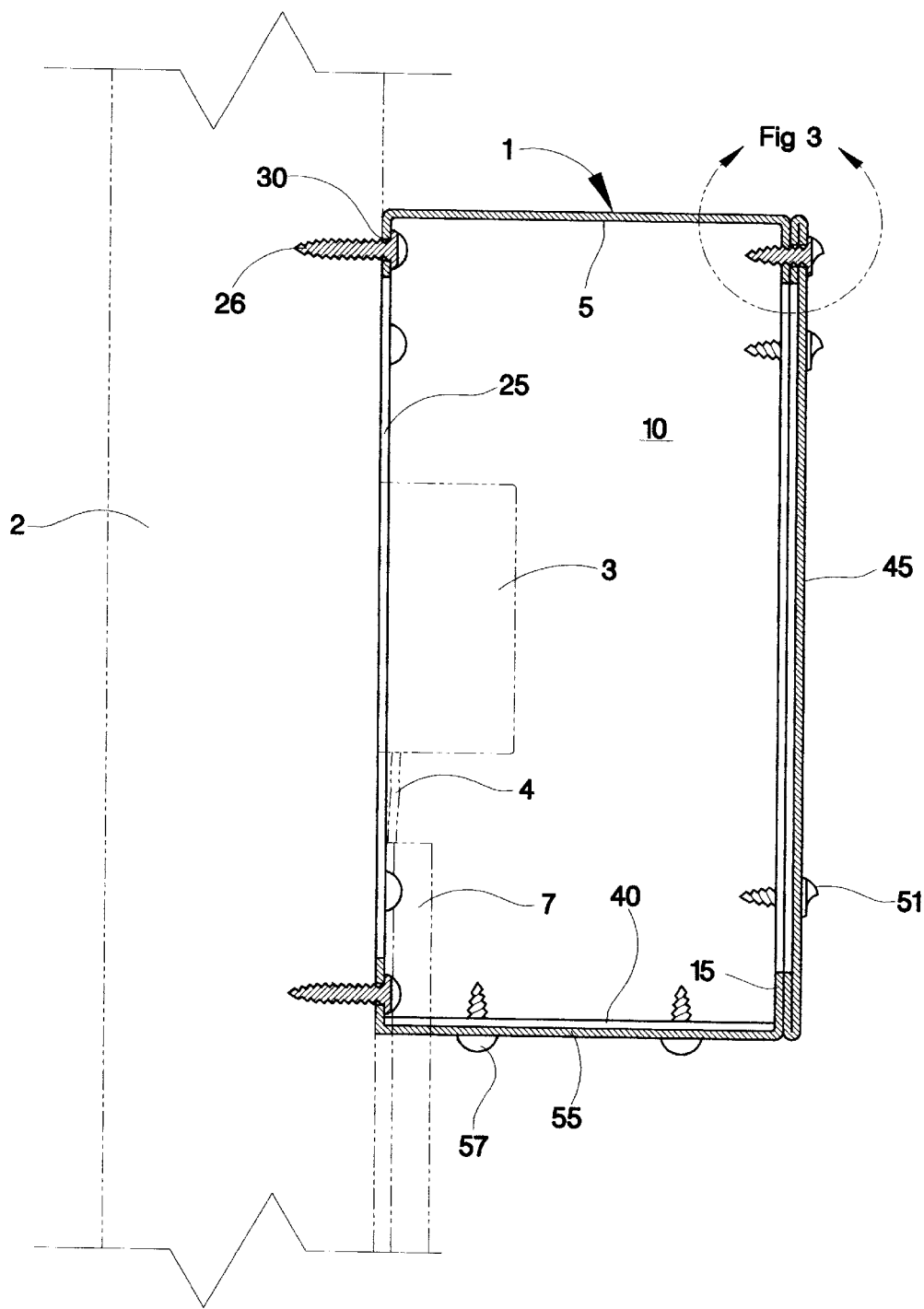
FIG. 3 is a side sectional view of the tamper resistant box.

Referring to FIG. 2, the rearward edge of the access panel 55 preferably has a notch 56, the notch 56 being fitted to closely overlie the wire protecting shield 7. Referring simultaneously to FIGS. 2 and 3, prior to installation of the false access panel 45, the upper wall 5 and the side walls 10, with attached access panel 55, are affixed to the wall 2 by means of common slot headed screws 26, such screws passing through apertures 30 of flanges 25, such screws 26 then passing into and being anchored within screw receiving apertures 27 drilled or punched into the wall 2. Preferably, the access panel 55 is affixed to the lower end of the box 1 by means of removable slotted screws 57 which extend upwardly through screw receiving apertures 60 and are anchored within screw receiving apertures 40.

Figure 4:
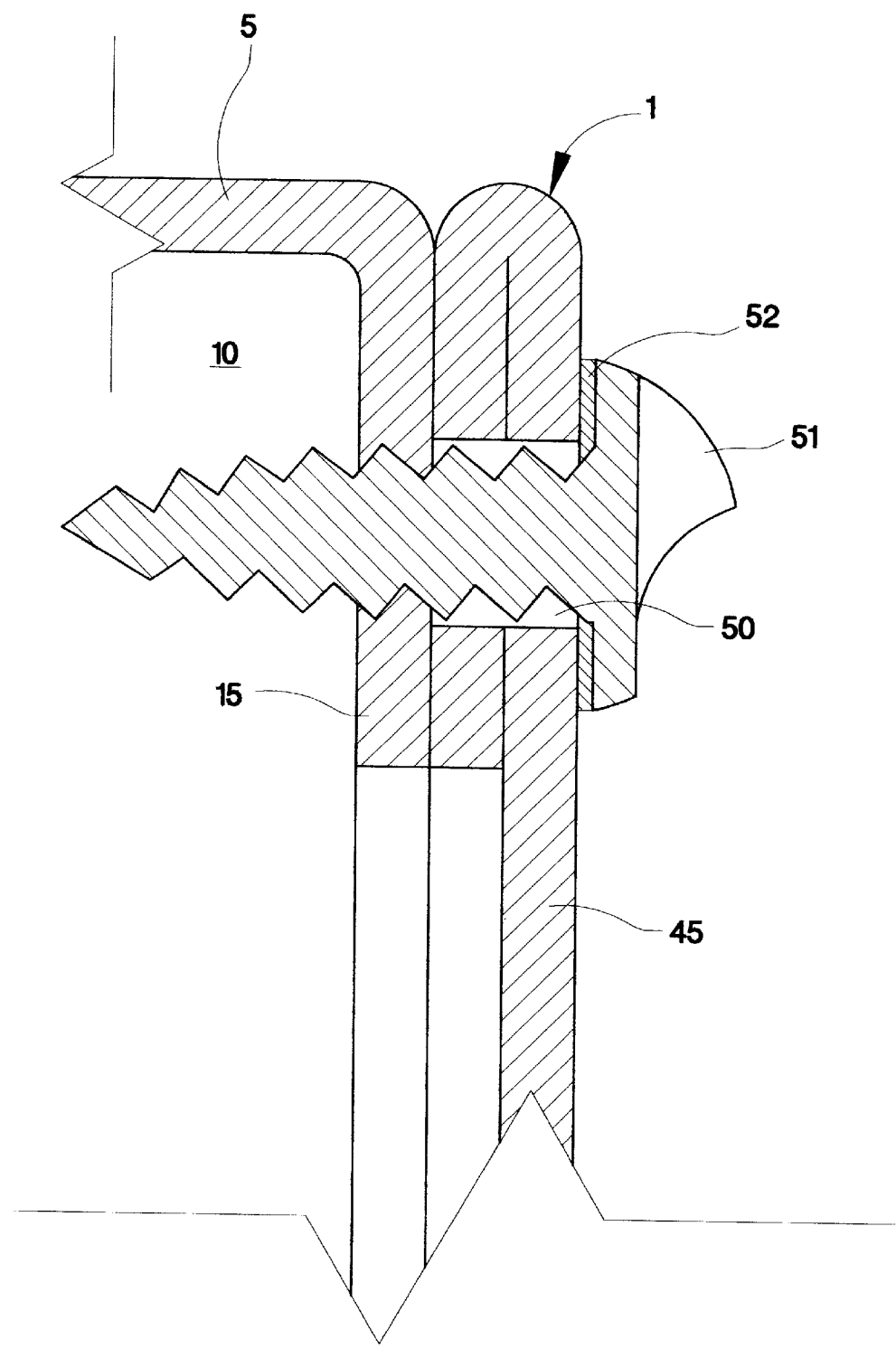
FIG. 4 is a magnified detail from FIG. 3.

Referring to FIG. 2, the last structural element installed in the assembly is the false access panel 45 which is preferably attached to the forward end of the tamper resistant box 1 by means of, referring to FIG. 4, one way slot headed screws 51. The one way slotted screws 51 pass through screw receiving apertures 50 to anchor within screw receiving apertures 20 within flanges 15. A layer of permanent adhesive 52 such as "lock tight" preferably is disposed between the undersurface of the head of each one way slot headed screw 51 and the outer surface of the false access panel 45, such adhesive layers 52 providing further assurance that the one way slot headed screws 51 cannot be removed by a burglar or intruder. Alternately, common removable slot headed screws may be used in combination with the adhesive. Also alternately, one way slot headed screws may be used without an adhesive.

Referring to FIG. 1, in operation of the tamper resistant box 1, a burglar or intruder seeking access at night into the interior of the tamper resistant box 1 will first encounter the one way slot headed screws 51. The burglar or intruder will erroneously conclude that all access panels to the box are similarly protected and the burglar or intruder will be dissuaded into attempting entry into the box. Where, during daylight, a repair person legitimately seeks entry into the box 1 for purpose of making telephone system repairs, the repair person may easily discover, referring to FIG. 2, the removable slot headed screws 57 attaching the access panel 55. Alternately, an occupant of the building who is knowledgeable of the features of the box 1 may inform the repair person of the lower access panel 55.

Referring to FIG. 2, it is preferable that where the telephone wire junction box 3 is installed at a low elevation with respect to the height of a typical intruder, the tamper resistant box be configured as depicted. Where the telephone wire junction box 3 is installed at a high elevation with respect to the height of an intruder, it is preferable to reverse the configuration depicted in FIG. 2 so that the access panel 55 forms a ceiling, and so that the side walls 10 extend perpendicularly upward from a floor instead of extending perpendicularly downward from the upper wall 5. Such selective configuration of the tamper resistant box 1 assures that no burglar or intruder will have a convenient view of the access panel 55 and its removable slot headed screws 57.

While the principles of the invention have been made clear in the above illustrative embodiment, those skilled in the art may make modifications in the structure, arrangement, portions and components of the invention without departing from those principles. Accordingly, it is intended that the description and drawings be interpreted as illustrative and not in the limiting sense, and that the invention be given a scope commensurate with the appended claims.

I claim:

1. A tamper resistant box for shielding from tampering a telephone system junction box installed upon a wall of a building, the tamper resistant box comprising:

(a) a pair of side walls, each side wall having a wall interface end, an outer end, an upper end, a lower end, an inwardly facing surface, and an outwardly facing surface;

(b) an upper wall fixedly attached to or homogeneously fused with the upper ends of the side walls, the upper wall spanning between the side walls, the upper wall having a wall interface end, an outer end, an inwardly facing surface, and an outwardly facing surface;

(c) wall attaching means fixedly attached to or homogeneously fused with the wall interface ends of the side walls, the wall attaching means being capable of fixedly attaching the side walls to the wall of the building;

(d) an access panel fitted so that it may span between the lower ends of the side walls, the access panel having a wall interface end, an outer end, an inwardly facing surface, and an outwardly facing surface;

(e) access panel attaching means capable of removably attaching the access panel to the lower ends of the side walls, the access panel attaching means attaching the access panel to the lower ends of the side walls;

(f) a false access panel fitted so that it may span between the outer ends of the side walls and so that it may span between the outer ends of the upper wall and the access panel; and, (g) false access panel attaching means capable of permanently attaching the false access panel to the outer ends of the side walls, the false access panel attaching means permanently attaching the false access panel to the side walls, the false access panel attaching means comprising a pair of false access panel attachment flanges, the false access panel attachment flanges being fixedly attached to or homogeneously fused with the outer ends of the side walls and positioned thereon so that they inwardly extend therefrom; a first plurality of screw receiving apertures extending through the false access panel attachment flanges; a second plurality of screw receiving apertures extending through the false access panel and positioned thereon so that they may overlie the first plurality of screw receiving apertures; a plurality of screws, each extending through one of the screw receiving apertures among the first plurality of screw receiving apertures and through one of the screw receiving apertures among the second plurality of screw receiving apertures; and a plurality of adhesive layers fixedly interconnecting the screws with the false access panel.

2. The tamper resistant box of claim No. 1, wherein the access panel attaching means comprises a pair of access panel attachment flanges fixedly attached to or homogeneously fused with the lower ends of the side walls, the access panel attachment flanges extending inwardly therefrom; a plurality of first access panel screw receiving apertures extending through the access panel attachment flanges; a plurality of second access panel screw receiving apertures extending through the access panel and positioned thereon so that they may overlie the first access panel screw receiving apertures; and a plurality of removable screws, each removable screw extending through one of the first and one of the second access panel screw receiving apertures.

3. The tamper resistant box of claim No. 2, wherein the wall attaching means comprises a pair of apertured flanges fixedly attached to or homogeneously fused with the wall interface ends of the side walls, the apertured flanges extending inwardly therefrom.

4. A tamper resistant box for shielding from tampering a telephone system junction box installed upon a wall of a building, the tamper resistant box comprising:

(a) a pair of side walls, each side wall having a wall interface end, an outer end, an upper end, a lower end, an inwardly facing surface, and an outwardly facing surface;

(b) a lower wall fixedly attached to or homogeneously fused with the lower ends of the side walls, the lower wall spanning between the side walls, the lower wall having a wall interface end, an outer end, an inwardly facing surface, and an outwardly facing surface;

(c) wall attaching means fixedly attached to or homogeneously fused with the wall interface ends of the side walls, the wall attaching means being capable of fixedly attaching the side walls to the wall of the building;

(d) an access panel fitted so that it may span between the upper ends of the side walls, the access panel having a wall interface end, an outer end, an inwardly facing surface, and an outwardly facing surface;

(e) access panel attaching means capable of removably attaching the access panel to the upper ends of the side walls, the access panel attaching means attaching the access panel to the upper ends of the side walls;

(f) a false access panel fitted so that it may span between the outer ends of the side walls and so that it may span between the outer ends of the lower wall and the access panel; and, (g) false access panel attaching means capable of permanently attaching the false access panel to the outer ends of the side walls, the false access panel attaching means permanently attaching the false access panel to the side walls, the false access panel attaching means comprising a pair of false access panel attachment flanges, the false access panel attachment flanges being fixedly attached to or homogeneously fused with the outer ends of the side walls and positioned thereon so that they inwardly extend therefrom; a first plurality of screw receiving apertures extending through the false access panel attachment flanges; a second plurality of screw receiving apertures extending through the false access panel and positioned thereon so that they may overlie the first plurality of screw receiving apertures; a plurality of screws, each extending through one of the screw receiving apertures among the first plurality of screw receiving apertures and through one of the screw receiving apertures among the second plurality of screw receiving apertures; and a plurality of adhesive layers fixedly interconnecting the screws with the false access panel.

5. The tamper resistant box of claim No. 4, wherein the access panel attaching means comprises a pair of access panel attachment flanges fixedly attached to or homogeneously fused with the upper ends of the side walls, the access panel attachment flanges extending inwardly therefrom; a plurality of first access panel screw receiving apertures extending through the access panel attachment flanges; a plurality of second access panel screw receiving apertures extending through the access panel and positioned thereon so that they may overlie the first access panel screw receiving apertures; and a plurality of removable screws, each removable screw extending through one of the first and one of the second access panel screw receiving apertures.

6. The tamper resistant box of claim No. 5, wherein the wall attaching means comprises a pair of apertured flanges fixedly attached to or homogeneously fused with the wall interface ends of the side walls, the apertured flanges extending inwardly therefrom.

7. A tamper resistant box for shielding from tampering a telephone system junction box installed upon a wall of a building, the tamper resistant box comprising:

(a) a pair of side walls, each side wall having a wall interface end, an outer end, an upper end, a lower end, an inwardly facing surface, and an outwardly facing surface;

(b) an upper wall fixedly attached to or homogeneously fused with the upper ends of the side walls, the upper wall spanning between the side walls, the upper wall having a wall interface end, an outer end, an inwardly facing surface, and an outwardly facing surface;

(c) wall attaching means fixedly attached to or homogeneously fused with the wall interface ends of the side walls, the wall attaching means being capable of fixedly attaching the side walls to the wall of the building;

(d) an access panel fitted so that it may span between the lower ends of the side walls, the access panel having a wall interface end, an outer end, an inwardly facing surface, and an outwardly facing surface;

(e) access panel attaching means capable of removably attaching the access panel to the lower ends of the side walls, the access panel attaching means attaching the access panel to the lower ends of the side walls;

(f) a false access panel fitted so that it may span between the outer ends of the side walls and so that it may span between the outer ends of the upper wall and the access panel; and, (g) false access panel attaching means capable of permanently attaching the false access panel to the outer ends of the side walls, the false access panel attaching means permanently attaching the false access panel to the side walls, the false access panel attaching means comprising a pair of false access panel attachment flanges, the false access panel attachment flanges being fixedly attached to or homogeneously fused with the outer ends of the side walls and positioned thereon so that they inwardly extend therefrom; a first plurality of screw receiving apertures extending through the false access panel attachment flanges; a second plurality of screw receiving apertures extending through the false access panel and positioned thereon so that they may overlie the first plurality of screw receiving apertures; a plurality of one way slot headed screws, each extending through one of the screw receiving apertures among the first plurality of screw receiving apertures and through one of the screw receiving apertures among the second plurality of screw receiving apertures.

8. The tamper resistant box of claim No. 7, further comprising a plurality of adhesive layers fixedly interconnecting the one way slot headed screws with the false access panel.

9. The tamper resistant box of claim No. 8, wherein the access panel attaching means comprises a pair of access panel attachment flanges fixedly attached to or homogeneously fused with the lower ends of the side walls, the access panel attachment flanges extending inwardly therefrom; a plurality of first access panel screw receiving apertures extending through the access panel attachment flanges; a plurality of second access panel screw receiving apertures extending through the access panel and positioned thereon so that they may overlie the first access panel screw receiving apertures; and a plurality of removable screws, each removable screw extending through one of the first and one of the second access panel screw receiving apertures.

10. The tamper resistant box of claim No. 9, wherein the wall attaching means comprises a pair of apertured flanges fixedly attached to or homogeneously fused with the wall interface ends of the side walls, the apertured flanges extending inwardly therefrom.

11. A tamper resistant box for shielding from tampering a telephone system junction box installed upon a wall of a building, the tamper resistant box comprising:

(a) a pair of side walls, each side wall having a wall interface end, an outer end, an upper end, a lower end, an inwardly facing surface, and an outwardly facing surface;

(b) a lower wall fixedly attached to or homogeneously fused with the lower ends of the side walls, the lower wall spanning between the side walls, the lower wall having a wall interface end, an outer end, an inwardly facing surface, and an outwardly facing surface;

(c) wall attaching means fixedly attached to or homogeneously fused with the wall interface ends of the side walls, the wall attaching means being capable of fixedly attaching the side walls to the wall of the building;

(d) an access panel fitted so that it may span between the upper ends of the side walls, the access panel having a wall interface end, an outer end, an inwardly facing surface, and an outwardly facing surface;

(e) access panel attaching means capable of removably attaching the access panel to the upper ends of the side walls, the access panel attaching means attaching the access panel to the upper ends of the side walls;

(f) a false access panel fitted so that it may span between the outer ends of the side walls and so that it may span between the outer ends of the lower wall and the access panel; and, (g) false access panel attaching means capable of permanently attaching the false access panel to the outer ends of the side walls, the false access panel attaching means permanently attaching the false access panel to the side walls, the false access panel attaching means comprising a pair of false access panel attachment flanges, the false access panel attachment flanges being fixedly attached to or homogeneously fused with the outer ends of the side walls and positioned thereon so that they inwardly extend therefrom; a first plurality of screw receiving apertures extending through the false access panel attachment flanges; a second plurality of screw receiving apertures extending through the false access panel and positioned thereon so that they may overlie the first plurality of screw receiving apertures; and a plurality of one way slot headed screws each extending through one of the screw receiving apertures among the first plurality of screw receiving apertures and through one of the screw receiving apertures among the second plurality of screw receiving apertures.

12. The tamper resistant box of claim No. 11, further comprising a plurality of adhesive layers fixedly interconnecting the one way slot headed screws with the false access panel.

13. The tamper resistant box of claim No. 12, wherein the access panel attaching means comprises a pair of access panel attachment flanges fixedly attached to or homogeneously fused with the upper ends of the side walls, the access panel attachment flanges extending inwardly therefrom; a plurality of first access panel screw receiving apertures extending through the access panel attachment flanges; a plurality of second access panel screw receiving apertures extending through the access panel and positioned thereon so that they may overlie the first access panel screw receiving apertures; and a plurality of removable screws, each removable screw extending through one of the first and one of the second access panel screw receiving apertures.

14. The tamper resistant box of claim No. 13, wherein the wall attaching means comprises a pair of apertured flanges fixedly attached to or homogeneously fused with the wall interface ends of the side walls, the apertured flanges extending inwardly therefrom.

* * * * *